United States Patent [19]

Shannon et al.

[11] Patent Number: 5,234,541
[45] Date of Patent: Aug. 10, 1993

[54] METHODS OF FABRICATING MIM TYPE DEVICE ARRAYS AND DISPLAY DEVICES INCORPORATING SUCH ARRAYS

[75] Inventors: John M. Shannon, Whyteleafe; Ian D. French, Brighton, both of England

[73] Assignee: U.S. Philips Corporation, New York, N.Y.

[21] Appl. No.: 706,824

[22] Filed: May 29, 1991

[30] Foreign Application Priority Data

Jun. 4, 1990 [GB] United Kingdom ............... 9012428

[51] Int. Cl.[5] .............................................. G09G 3/36
[52] U.S. Cl. ....................................... 156/651; 156/655; 156/656; 156/657; 359/58; 359/62; 359/79
[58] Field of Search ........................... 359/58, 79, 62; 156/656, 657, 651, 655

[56] References Cited

U.S. PATENT DOCUMENTS

| 4,413,883 | 11/1983 | Baraff et al. | 359/62 X |
| 4,653,858 | 3/1987 | Szydlo et al. | 156/656 X |
| 4,892,389 | 1/1990 | Kuijk | 359/58 X |
| 4,913,674 | 4/1990 | Nicholas | 445/24 |
| 5,056,894 | 10/1991 | Kuijk et al. | 359/60 X |
| 5,101,288 | 3/1992 | Ohta et al. | 359/79 X |

Primary Examiner—Thi Dang
Attorney, Agent, or Firm—John C. Fox

[57] ABSTRACT

An array of MIM type devices carried on a support together with an array of electrodes and address conductors suitable for use in an active matrix display device is fabricated using only one mask by forming on the substrate (11) a multi-layer structure comprising a lower resistive layer (30), e.g. of a-Si, an insulating layer (31) e.g. of silicon nitride and an upper conductive layer (32) and performing a patterning process, involving an etching operation whereby regions of the structure are removed to leave portions, as determined by the mask, constituting the electrodes (25), the address conductors (28) and at least one bridging portion (34) between each electrode (25) and an associated conductor (28) and whereby a part of the conductive layer (32) at each bridging portion is removed so as to form a lateral MIM type device (10) connecting each electrode to its address conductor. Metal strips (40) may be formed bordering the edges of the electrodes and conductors by using temporary additional layers and lift-off techniques.

23 Claims, 6 Drawing Sheets

METHODS OF FABRICATING MIM TYPE DEVICE ARRAYS AND DISPLAY DEVICES INCORPORATING SUCH ARRAYS

BACKGROUND OF THE INVENTION

This invention relates to methods of producing an array of MIM type devices, together with address conductors and pad electrodes, on a common substrate for use particularly, although not exclusively, in active matrix addressed display devices, for example liquid crystal display devices.

Known MIM devices, generally comprising a thin film insulating layer sandwiched between two conductive layers across which in use a voltage is applied, can be regared as a kind of diode structure in that they exhibit a non-linear resistive characteristic and have been used in active matrix addressed liquid crystal display devices as switching elements in the addressing of the display device's picture elements. These two terminal devices offer advantages over TFTs also used for such purposes in that they are comparatively simple to fabricate and require fewer address lines, with no crossovers, on their supporting substrate.

Examples of arrays of MIM devices for liquid crystal display devices and their method of fabrication are described in U.S. Pat. No. 4,413,883 and U.S. Pat. No. 4,683,183.

The MIM addressed display devices consist of first and second glass substrates carrying respectively sets of row and column address conductors with individual picture elements being provided at the region of the intersections of the crossing row and column conductors. A picture element electrode carried on the first substrate is connected electrically to a row conductor via at least one MIM device which is also carried on the first substrate. The MIM devices acts as bidirectional switches having a threshold characteristic and in response to an applied voltage are turned on to allow video data signal voltages to be transferred to the picture elements to cause the desired display response.

Although generally referred to as a Metal-Insulator-Metal device, conductive materials such as indium tin oxide (ITO) can be used as one or both of the "metal" layers and the acronym should be construed accordingly. Moreover, the terms "insulator" and "insulating layer" as used herein are intended to be construed in the wider sense to include semi-insulators and non-stoichiometric materials known in the field of MIM devices. The device switching characteristics are dependent on the composition and thickness of the insulating layer and are determined by the charge transfer mechanisms involved. The switching behaviour of many MIM devices results from tunnelling or hopping of carriers in the thin film insulating layer and in this respect the voltage/resistance characteristic of the device is dependent on the magnitude of the electric field and thus the nature and thickness of the insulating layer. In some forms of MIM devices the mechanism is controlled by the barrier between the metal and the (semi-) insulator. The aforementioned specifications describe various forms of MIM devices using different materials. For the conductive layers suitable materials include nickel, chromium, tantalum, aluminium or other metal. The insulator layer may be of silicon nitride, silicon dioxide, silicon oxynitride, silicon monoxide and zinc oxide may be used for the insulator. Further examples of MIM structures used in display devices, comprising non-stoichiometric materials, are described in EP-A-0182484.

The I-V characteristics of these MIM devices tend to be asymmetric. In order to provide symmetrical characteristics, which readily permit the desirable polarity reversal of addressing signals when driving the display devices, it has been proposed in U.S. Pat. No. 4,413,883 that a pair of MIM devices connected in series back to back configuration or in parallel opposition configuration be used for each picture element, whereby substantially symmetric I-V characteristics are obtained. In a described embodiment, a pair of MIM devices are disposed side by side on a support with respective first terminals of each device being interconnected through, and comprising portions of, a single layer defined on the support. The method of fabricating the pairs of MIM devices together with display element electrodes and addressing conductors involves a number of definition processes requiring a plurality of masks and exposures.

While active matrix substrates of display devices using MIM devices are generally simpler to construct, and thus less expensive, than those using TFTs as switching elements, there is still a need to improve yields and reduce costs further. Also, it has been found in the fabrication of display devices that MIM devices, which are susceptible to the effects of static electricity, are easily damaged as a result of static charges being produced in certain manufacturing operations.

OBJECTS AND SUMMARY OF THE INVENTION

It is, therefore, an object of the invention to provide a method of fabricating an array of MIM type devices on a substrate, together with addressing conductors and associated electrodes, which is comparatively simple and inexpensive.

It is another object of the present invention to provide an array of MIM type devices together with addressing conductors and associated electrodes on a common support which is suitable for use in an active matrix addressed display device, and which is less susceptible to damage by static discharge.

According to a first aspect of the present invention there is provided a method of fabricating an array of MIM type devices together with a set of address conductors and a plurality of pad electrodes on a common substrate, each pad electrode being connected with an associated address conductor via at least one MIM type device, which comprises the steps of providing over the substrate surface superposed thin film layers forming a multilayer structure comprising in order from the substrate surface an insulating layer and a conductive layer, and thereafter performing a patterning process on the multi-layer structure with the aid of a mask to leave regions as defined by the mask comprising the pad electrodes, the address conductors and at least one comparatively narrow portion bridging each pad electrode and its associated address conductor, and to remove a part of the conductive layer of the multi-layer structure at each bridging portion to form a discontinuity in the conductive layer between the address conductor and the pad electrode whereby a MIM type device is formed at each bridging portion. In a preferred embodiment of the method, the multilayer structure further includes a resistive layer over which the insulating and conductive layers are disposed. With this method, the fabrication of the MIM type device array with pad electrodes, for example display element electrodes, and address conductors on a common substrate is accomplished in a very simple and reliable manner involving only one mask and exposure to define these components, compared with conventional fabrication processes requiring a plurality of masks and exposures. Processing is therefore considerably less complicated. Importantly, the method offers the considerable advantage of being a non-registration method. The need for alignment of component parts at various stages of fabrication necessary in known multiple-mask methods is avoided. Consequently the invention readily enables large area arrays, and hence display devices, to be produced much more simply, and thus less expensively.

Although particularly suitable for use as a component in an active matrix addressed display device, it is envisaged that the array of MIM type devices formed together with their set of address conductors and pad electrodes on a common substrate by this method could be used as a component in other devices, possibly with other elements being formed on the substrate.

A single bridging portion, providing a single MIM type device, may be defined between each pad electrode and its associated address conductor. Alternatively, a plurality of individual bridging portions may be defined between each pad electrode and its associated address conductor whereby a plurality of MIM type devices are obtained electrically in parallel between the pad electrode and its address conductor to allow a larger current flow between the address conductor and pad electrode and also to provide a degree of redundancy.

The MIM type devices produced by the preferred embodiment are of a lateral kind. They each comprise overlying resistive and insulating layers and two, spaced, terminals, constituted by parts of the conductive layer immediately adjacent the discontinuity, and integral respectively with the conductive layer regions forming the associated address conductor and pad electrode, on the surface of the insulating layer remote from the resistive layer. Each MIM type device exhibits substantially symmetrical behaviour in operation, that is, substantially symmetric I–V characteristics are obtained for both polarities of applied voltage, which enables the periodic reversal of drive voltage polarity desirable in LC display devices to avoid any significant DC component across the LC material. For simplification of understanding its structure and behaviour, the device could be regarded as equivalent to a pair of series-connected bi-directional non-linear elements arranged back to back.

The resistive layer of the MIM type device structure resulting from this method offers an important advantage in that it introduces an effective series resistance which protects the device from static damage whilst allowing the MIM type device to behave generally the same as a conventional device in normal operation. The resistive layer serves to limit current flow at higher applied voltages, i.e. above the normal operating range, and only has an appreciable effect when a high voltage is applied, that is the kind of voltage levels associated with static electricity. At comparatively low voltage levels around those normally used for driving MIM devices in display devices and with which the MIM type device is designed to operate, the resistive layer has practically no effect on the non-linear, switching, characteristic of the device.

The set of address conductors and the pad electrodes provided by this method predominantly comprise, so far as their intended functions are concerned, regions of the conductive layer. The underlying regions of the insulating and resistive layers are largely superfluous to the operation of the address conductors and pad electrodes in, for example, a display device. Providing the component parts are correctly designed, the presence of these two layers should not affect significantly the operation of the address conductors and pad electrodes.

The resistive layer may comprise amorphous silicon material. Such material can conveniently be deposited in a simple manner, using commonly known techniques, to the required thickness. Moreover, this material can be selectively doped to tailor the resistivity of the resistive layer for optimum performance. Alternatively, oxygen doped polycrystalline silicon material or other suitable resistive materials, such as doped silicon carbide, may be employed for this layer. If used in a display device operating in transmissive mode the pad electrode should be transparent. Because the resistive layer is present at these pad electrodes the material used preferably is a wide band gap, doped, semi-insulating material exhibiting transparency.

Preferably, particularly for a transmissive display device, the material of the conducting layer comprises ITO. If then a substantially transparent insulating material, such as silicon nitride, is used for the insulator layer and a wide band-gap, doped material such as amorphous silicon is used for the resistive layer, the pad electrodes can be substantially transparent.

The thickness of the material, for example, amorphous silicon material, constituting the resistive layer accordingly is kept to a minimum so as to provide adequate transparency, although inevitably some light will be absorbed by this layer in the picture elements of the display device.

The conductive layer could alternatively comprise any material commonly used in the art, for example tin oxide. If transparency is not required, as in a display device operating in reflective mode, the conductive layer may be of a metal such as chromium, tungsten, tantalum, nichrome, aluminium or titanium. The insulating layer may be of various different materials as known in the art such as silicon dioxide, silicon monoxide, silicon nitride, silicon carbide, non-stoichiometric, for example silicon-rich, mixtures of these materials such as non-stoichiometric silicon nitride or silicon oxynitride, or tantalum oxynitride.

In an embodiment of the method according to the invention, the patterning process involves forming a resist pattern over the multi-layer structure and carrying out an etching operation through which areas of the multi-layer structure determined by the resist pattern are completely removed and the parts of the conductive layer at the bridging portions are etched away. The etching operation may comprise a two stage process. In the first stage, the areas of the multi-layer structure are removed by anisotropic etching, for example reactive ion etching. In the second stage selective isotropic etching, for example plasma etching, is used to remove the conductive layer parts beneath the resist pattern at the bridging portions. The bridging portions are comparatively narrow and the conductive layer at these portions is etched away from both sides across their width in convenient manner using this approach. Although other exposed edges of the conductive layer at the address conductors and pad electrodes are also etched in this process the effect is not significant in view of the comparatively large dimensions of these components.

In the case where, for example, ITO is used for the conductive layer this material may not in certain circumstances be sufficiently conductive for the requirements of the address conductors. In another embodiment of the method according to the invention therefore, a metal border is formed around the edges of the address conductors for increased conduction. A similar border can be provided around the edges of the pad electrodes. Preferably a metal layer is deposited after the etching operation and predetermined areas of this layer are then removed, by a lift-off process, to leave portions constituting the borders. To this end, a further, temporary, layer, for example of aluminium, is deposited over the conductive layer prior to performing the patterning process. In the patterning process a resist pattern is formed over the multi-layer structure, including this further layer, and an etching operation carried out, similar to the previous embodiment, through which areas of the multi-layer structure determined by the resist pattern are completely removed and the parts of the conductive layer at the bridging structure together with the overlying parts of the further layer are etched away, again preferably by means of a two stage etching process. Thereafter, a second temporary layer, preferably of the same material as the further layer, is deposited over the structure on the substrate, including the resist pattern, following which the resist pattern is removed, together with the overlying portions of the second temporary layer, and a metal layer, for example of chromium, is deposited. Finally, the remaining portions of the further, temporary, layer and second temporary layer are removed together with the portions of the metal layer overlying these portions. The resultant structure is similar to that of the previous embodiment except that the peripheral edges of the row address conductors and pad electrodes are bordered by bands of metal.

According to another aspect of the invention there is provided an active matrix addressed display device, for example a liquid crystal display device, having a matrix array of picture elements each comprising a first, pad, electrode and a second opposing electrode carried on facing surfaces of two spaced supports with electro-optic material therebetween and with the pad electrode of each picture element being connected to an associated one of a set of address conductors on one support via at least one MIM type device, which is characterised in that the MIM type devices, the set of address conductors and the pad electrodes on the one support are fabricated by the method according to the first aspect of the present invention.

BRIEF DESCRIPTION OF THE DRAWINGS

Methods of fabricating arrays of MIM type devices together with address conductors and pad electrodes on a common support and active matrix addressed liquid crystal display devices incorporating such arrays, in accordance with the present invention will now be described, by way of example, with reference to the accompanying drawings, in which.

It should be understood that the Figures are merely schematic and are not drawn to scale. In particular certain dimensions such as the thickness of layers or regions may have been exaggerated whilst other dimensions may have been reduced. It should also be understood that the same reference numerals have been used throughout the Figures to indicate the same or similar parts.

DESCRIPTION OF THE PREFERRED EMBODIMENTS

Figure 1:
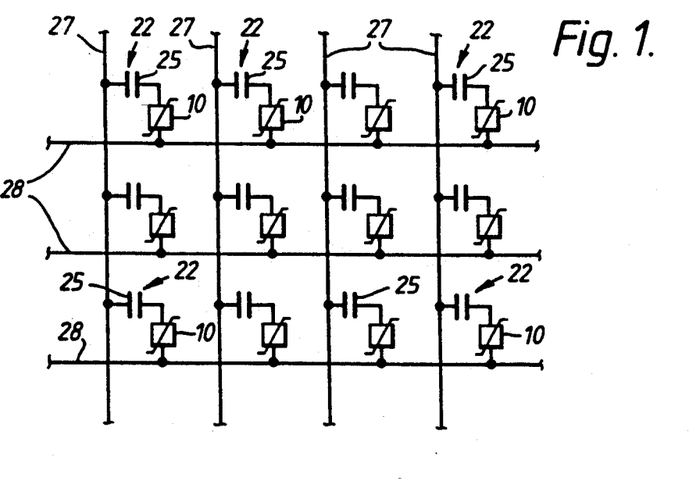
FIG. 1 is a schematic circuit diagram of part of a liquid crystal display device according to the invention showing a number of picture elements each connected in series with a two terminal, non-linear switching element in the form of a MIM type device between row and column address conductors.
Figure 2:
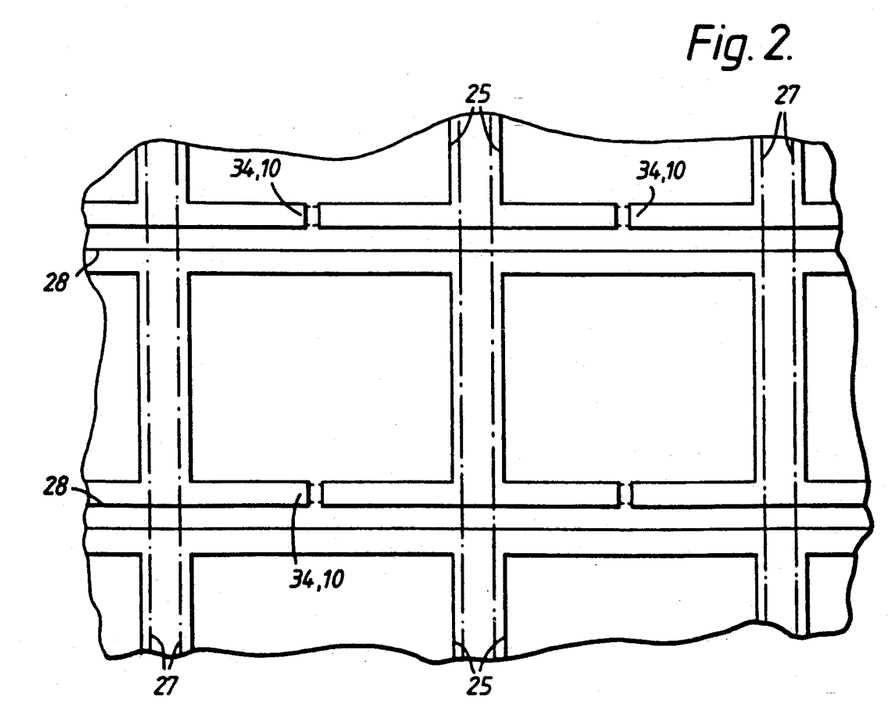
FIGS. 2 and 3 are schematic plan and cross-sectional views of parts of one embodiment of the display device.
Figure 3:
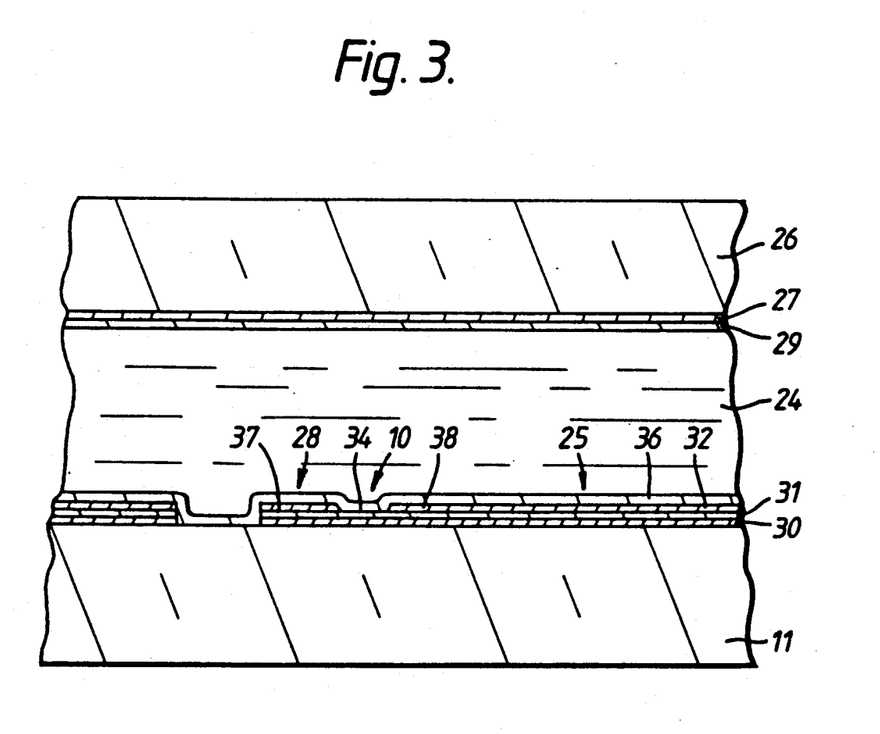

Referring to FIGS. 1 to 3, the display device has a row and column matrix array of individual picture elements 22, only twelve of which are depicted in FIG. 1. Each element 22 comprises a pair of electrodes carried on the facing surfaces of two, spaced, glass substrates 11 and 26 with TN liquid crystal material 24 therebetween (FIG. 3). The substrate 11 carries an array of MIM type devices and in addition, the array of individual, generally rectangular, picture element pad electrodes 25 arranged in rows and columns and defining individual picture elements 22. The substrate 26, as is usual for such display devices, carries a set of spaced, parallel, column address conductors 27, of transparent ITO, portions of which, where they overlie picture element electrodes 25, constitute the other electrodes of the elements. The part of the display device comprising the glass substrate 26 and set of column conductors 27 is fabricated in conventional manner by deposition and definition of ITO material. The exposed surface of the structure is covered by an LC orientation layer 29 of known type.

The picture element electrodes 25 of all picture elements in the same row are connected on the substrate 11 to an associated one of a set of parallel row address conductors 28 extending at right angles to the column conductors 27, via their associated, series-connected, MIM type devices 10.

The individual picture elements 22 are addressed in conventional fashion by applying scanning signals to each row conductor 28 in turn and video data signals appropriately, in synchronism, to the column conductors 27 (or vice versa) to operate the picture elements and modulate light transmission there through in accordance with supplied video information. The elements are typically driven using an applied voltage of between 11 and 15 volts. They are energised on a row at a time basis so as to build up a display picture, e.g. a TV picture, over one field.

The display device, and its operation, is similar in many respects to known active matrix LC display devices using MIM type non-linear switching elements. Accordingly, the foregoing general description of the display device has deliberately been kept brief. For further information, reference is invited to the specifications mentioned earlier whose disclosure in these general respects is incorporated herein by reference.

Referring now particularly to FIG. 2 and 3, each MIM type device 10 forms an interconnecting bridge between a picture element pad electrode 25 and a row conductor 28 and comprises a pair of spaced terminals, integral with the row conductor 28 and electrode 25 respectively, which, as will be described more fully, overlie an insulating layer, which in turn overlies a resistive layer, the insulating and resistive layers being substantially co-extensive and of strip shape.

Figure 4:
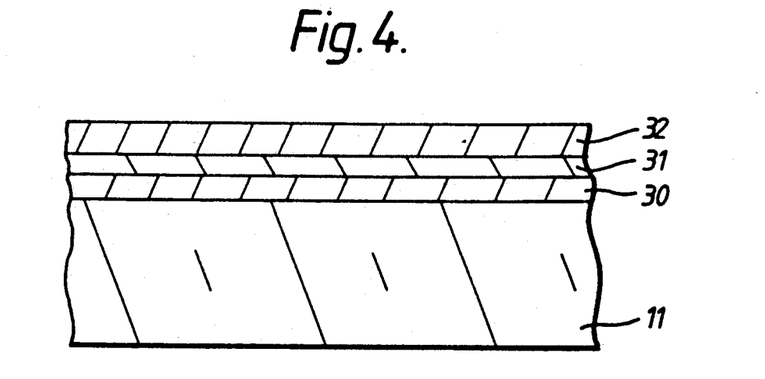
FIGS. 4 and 5 are schematic cross-sectional views of a part of a typical picture element region of the display device of FIGS. 2 and 3 at different stages in its fabrication.
Figure 5:
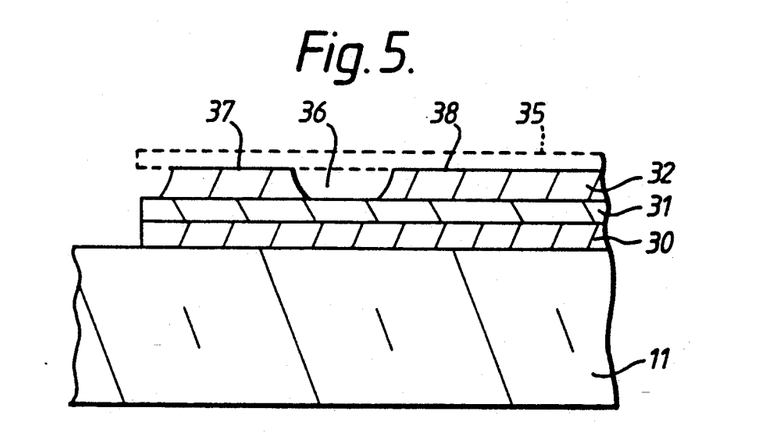
Figure 6:
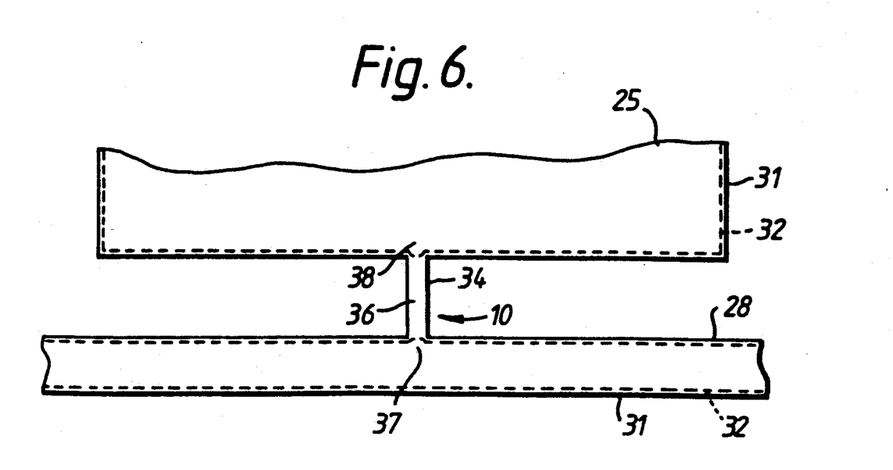
FIG. 6 shows in plan view an individual picture element electrode and its associated MIM type device of the device of FIGS. 2 and 3.

One method of fabricating the part of the display device comprising the substrate 11, picture element pad electrodes 25, row address conductors 28 and MIM type devices 10 will now be described with reference particularly to FIGS. 4, 5 and 6.

A multi-layer structure is built upon, and completely covering, the surface of the substrate 11 by successive deposition operations using any suitable known techniques. First, a uniform thickness resistive layer of hydrogenated amorphous silicon material, a-Si: H, 30, is deposited, for example, by a plasma deposition process, directly on the surface of the substrate. This is followed by a uniform insulating layer of silicon nitride material, 31, for example, again by a plasma deposition process. More specifically the material of layer 31 consists of silicon-rich silicon nitride, a semi-insulator, comprising approximately 75 per cent silicon. Finally a conductive layer 32 comprising transparent ITO is deposited over the insulating layer 31 by evaporation or sputtering. A part of the resulting structure is shown in FIG. 4.

The multi-layer structure is then subjected to an patterning process, using a photolithographic technique in which unwanted regions of the structure are removed to leave regions which ultimately constitute the pad electrodes 25, row conductors 28 and MIM type devices 10. A layer of photo-resist is disposed over the multi-layer structure and exposed through a mask in conventional fashion to produce a resist pattern, a part of which is shown in dotted outline at 35 in FIG. 5, defining the regions which are to be retained, namely the array of rectangular electrodes 25, the set of row conductors 28 extending between the electrodes 25 and narrow bridging strips 34 interconnecting each electrode 25 with an associated row conductor, as depicted in FIG. 6. The unwanted regions of the multi-layer structure, as determined by the resist pattern, are then etched away in an etching operation. This etching operation is a two stage process. In the first stage the structure is subjected to an anisotropic etch, using reactive ion etching or sputter etching, whereby the multilayer structure is etched vertically down to the substrate surface according to the resist pattern to define the pad electrode, address conductor and bridge portions. In the second stage the remaining structure is subjected to a selective isotropic etch, using for example plasma etching or wet etching, which operates on the conductive layer 32 and through which a central part 36 of the conductive layer at each bridging portion 34 is removed completely across its width by under-etching forming a discontinuity in the conductive layer between parts 37 and 38 of the conductive layer, continuous with the row conductor 28 and electrode 25 respectively, immediately adjacent the bridging portion, as shown in the sectional view through the resulting bridge portion structure of FIG. 5. Some etching occurs also to the conductive layer 32 around the periphery of the eventual electrodes 25 and row conductors 28 as shown in dotted outline in FIG. 6 but the effect of this is not significant. Each bridging portion 34 is comparatively narrow so that only limited etching is necessary to etch away an area of the conductive layer under the resist at the bridging portion to render the layer discontinuous. Following this etching operation the remaining resist material is removed.

The row conductors and pad electrodes thus formed comprise regions of the multi-layer structure, although so far as their respective functions are concerned it is only the upper, conductive, layer of the structure which is of consequence. The underlying insulating and resistive layers should not play any significant part in the intended function of these components in subsequent use.

By way of example, the width of the row conductors is around 10 to 20 micrometers, the bridging portion 34 is around 8 micrometers in length and 4 micrometers in width, and the thicknesses of the resistive, insulator and conducting layers 30, 31 and 32 is around 30 nm, 50 nm and 100 nm, respectively. The electrodes 25 are of the usual size. The thickness of the layer 32 ideally should be such that it exhibits sufficient conductivity having regard to its function in the row address conductors 28 where this layer is responsible for carrying the address signals. The thickness and composition of the layer 31 is selected to give the required non-linear characteristic. The thickness of the a-Si: H material of layer is chosen having regard both to its function in the MIM type devices 10, as will be described, and also its effect on light transmissivity through the picture elements defined by the pad electrodes 25. The resistivity of this material can be tailored by suitable doping and in this example is selected to be around $10^5$ to $10^6$ ohm cm.

Each bridging portion 34 constitutes a MIM type device 10 of lateral form whose two terminals comprise the separated conductive layer parts 37 and 38 with superposed insulator and resistive material extending over and between these two parts.

Figure 7:
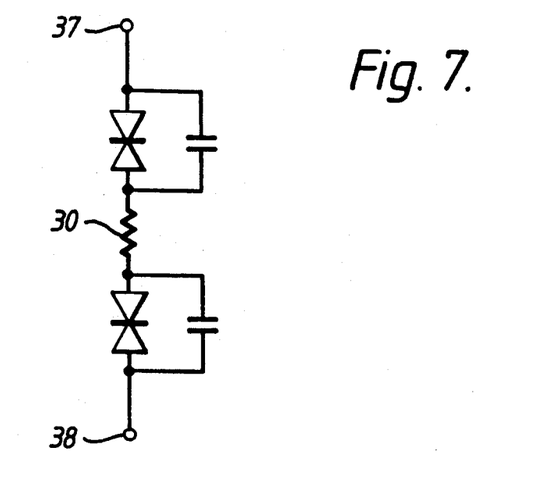
FIG. 7 shows the equivalent circuit of a MIM-type device.

The MIM type devices demonstrate a switching characteristic by virtue of their non-linear current/voltage property given by their insulator layer and exhibit substantially symmetrical behaviour in operation showing substantially identical switching effects in response to opposing polarity voltages of the same magnitude being applied. The MIM type devices 10 can be considered for simplicity as equivalent functionally to two non-linear MIM like elements connected in series back to back, the two elements consisting of the layers 37 and 38 respectively together with their immediately underlying portions of the layers 30 and 31, the portions of layer 30 serving in effect as second terminals of the elements. These second terminals of the two elements are interconnected via the intermediate part of the resistive layer 30. A simple equivalent circuit representation of a MIM type device 10 is illustrated in FIG. 7.

The resistive layer 30 introduces an effective series resistance which limits current flow at higher voltages and protects the devices from static damage. The MIM devices function similarly to conventional MIM devices in subsequent use, in this case as switching elements in a display device. Providing the layer thicknesses are suitably chosen, it can be expected that the devices will act in generally identical manner, in terms of their electrical performance, as standard forms of MIM devices. The series resistance produced by the resistive layer, which will be between 100 Kohms and 1 Mohm for the above described example, will only have any appreciable effect when high voltages are present, as would be the case with static electricity. In the analogous model discussed, an effective series resistance is present in each of the two non-linear elements. At normal voltage levels, that is voltages at which the devices are intended normally to be operated when used for example in a display device, typically between 5 and 20 volts, the devices behave substantially like a conventional MIM device.

Although in the above embodiment particular materials have been described for the constituent layers, it will be appreciated that other materials may be used. For example oxygen-doped polycrystalline silicon or doped silicon carbide may be used for the resistive layer 30. The material chosen for the resistive layer 30 should ideally satisfy a number of requirements. As well as providing an adequate series resistance in the MIM type device, it should also be sufficiently resistive that parts thereof other than those at the region of the device do not start to charge up in the period during which a picture element is addressed in operation of the display device. Also, the material should have sufficient ionisable centres or provide sufficient space charge when a predetermined voltage is applied to enable the field across the insulating layer 31 to rise causing conduction. Silicon dioxide silicon oxy-nitride, tantalum pentoxide, aluminum oxide, and particularly non-stoichiometric mixtures of these materials, may be used for the insulating layer. The thickness of the insulating layer 31 is suitably varied according to the particular material employed so that the necessary MIM action is obtained.

Other transparent conductive materials could be used for the layer 32. For a display device which is to be operated in reflective mode or in other applications in which the array of MIM type devices are to be used, this conductive layer could be formed of metal.

Referring to FIG. 3, the structure on the substrate 11 is covered by a continuous layer of liquid crystal orientation material as shown at 36. The substrates 11 and 26 are then assembled together and LC material introduced therebetween to complete the display device.

Various modifications are possible, as will be apparent to persons skilled in the art. For example as shown in FIG. 7, a plurality of bridging portions may be defined during the patterning process between each picture element electrode 25 and its row conductor 28, each of which portions constitutes an individual MIM type device 10. The picture element is then connected to its row conductor via parallel MIM type devices.

The above-described method thus enables an array of MIM type devices together with pad electrodes and address conductors to be fabricated on a substrate using only one mask and one exposure operation.

Figure 9:
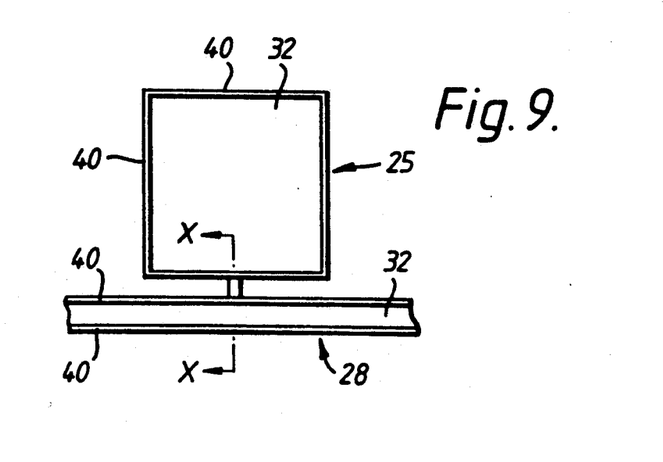
FIG. 9 is a plan schematic view of an individual picture element electrode and its associated MIM type device and address conductor of another embodiment of display device.

In the case where ITO is used for the conductive layer 32 in view of its transparency, this material might not always be sufficiently conductive to alone satisfy the requirements for the row conductors when driving the display device. In another embodiment a modified method of fabricating the array is used which results in metal strips being formed around the peripheral edges of the patterned conductive layer constituting the row conductors and pad electrodes to improve the conductive properties of these parts. FIG. 9 illustrates schematically in plan view of a typical pad electrode 25 together with its MIM type device 10 and associated row conductor 28 formed using this method. As shown, the portions of the conductive layer 32 constituting the pad electrode 25 and row conductor 28 are bordered by contacting strips 40 of metal.

Figure 10A:
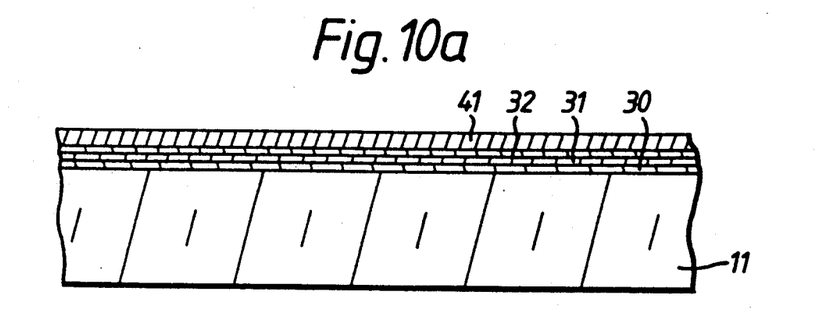
FIGS. 10a to 10f are schematic cross-sectional views of a part of a typical picture element region of the device of FIG. 8 illustrating different stages in its fabrication.
Figure 10B:
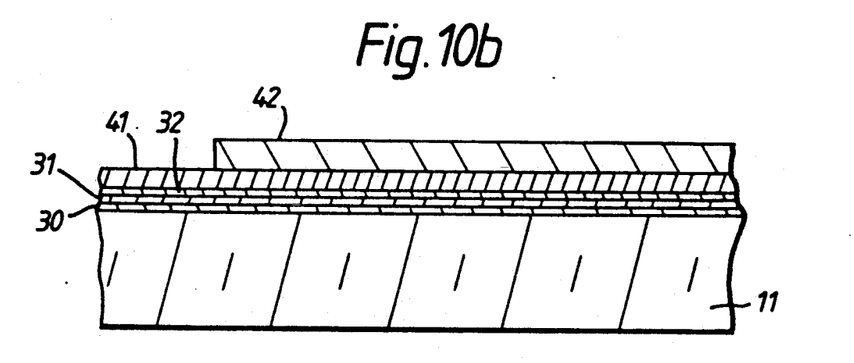

The method by which this is achieved will now be described with reference to FIGS. 10a-f which illustrates in cross-section various stages in the method. The region depicted in FIGS. 10a-f is along the line X—X in FIG. 9, i.e. through a bridging portion. Steps in this method are similar to those described with regard to the previous embodiment and consequently will not be described here again in detail. As before, successive resistive, insulating and conductive layers 30, 31 and 32, comprising n+amorphous silicon, silicon-rich silicon nitride and ITO, are formed on the surface of the substrate 11. In addition, a temporary layer of aluminium 41 is deposited on the conductive layer 32 to complete the multilayer structure, as shown in FIG. 10a.

Figure 10C:
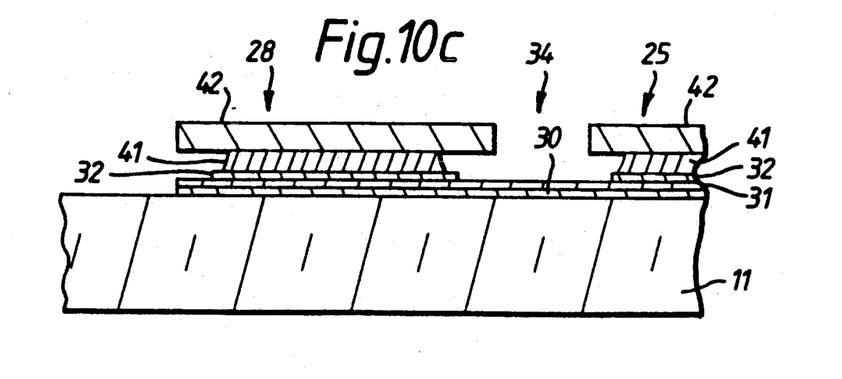

A similar patterning procedure to before is then used to define photolithographically the address conductors, pad electrodes and bridging portions. A layer of photoresist is deposited over the layer 41 and, using a single mask and a single exposure, is patterned to leave areas of resist as shown in part at 42 in FIG. 10(b). The structure is then subjected to an anisotropic dry etch process in which areas of the multi-layer structure are etched away vertically downwards to the substrate surface to leave regions, determined by the resist pattern, which will constitute the pad electrode 25, address conductors 28 and bridging portions 34. A selective wet etch or plasma etch process is then carried out on the ITO and Al layers 32 and 41 beneath the edges of the resist pattern whereby a part of those two layers is removed across the width of each bridging portion 34 to render the layers discontinuous between the address conductor and the pad electrodes. The resulting structure is illustrated in FIG. 10(c). Through this isotropic etch sections of the resist pattern over the bridging portions 34 are also removed by lift-off as a result of the etching of the underlying parts of pagers 32 and 41. Edge regions of the layers 32 and 41 elsewhere are also etched away by this process but because the bridging portions are comparatively narrow the extent of material removal required is small and consequently the removal of edge regions of these layers elsewhere, i.e. around the address conductors and pad electrodes, is not significant.

Figure 10D:
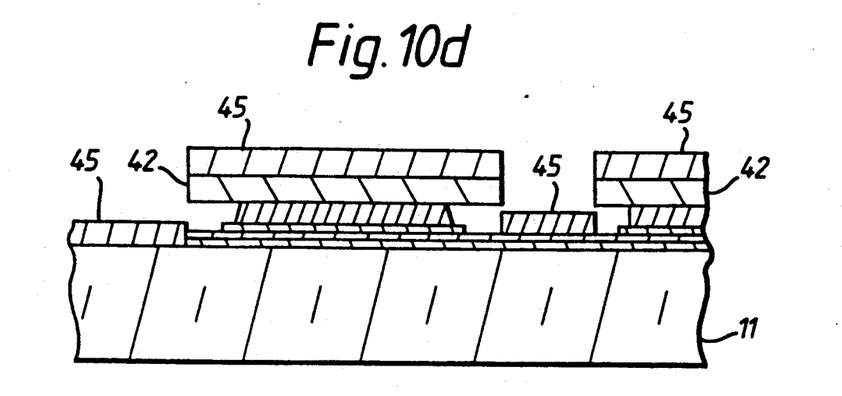
Figure 10E:
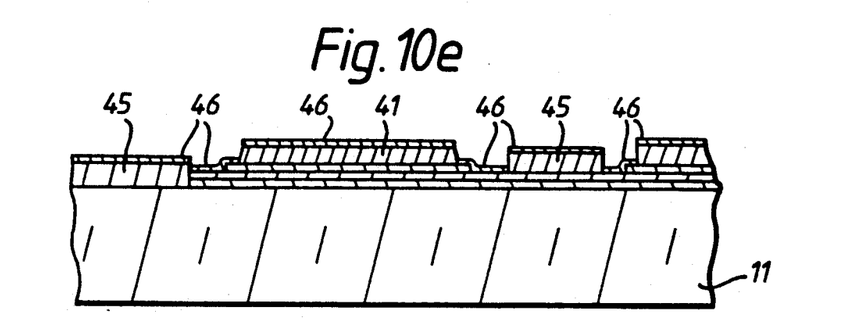

With the remaining resist pattern still in situ, another temporary layer 45 of aluminium is then evaporated vertically downwards over the entire structure surface, as shown in FIG. 10(d) to a thickness slightly greater than the combined thickness of layers 30 and 31. In a lift-off step the resist pattern is removed, taking with it the parts of the deposited aluminium layer 45 over the resist material. A layer of chromium 46 is then evaporated vertically over the exposed surface producing the structure shown in FIG. 10(e).

Figure 10F:
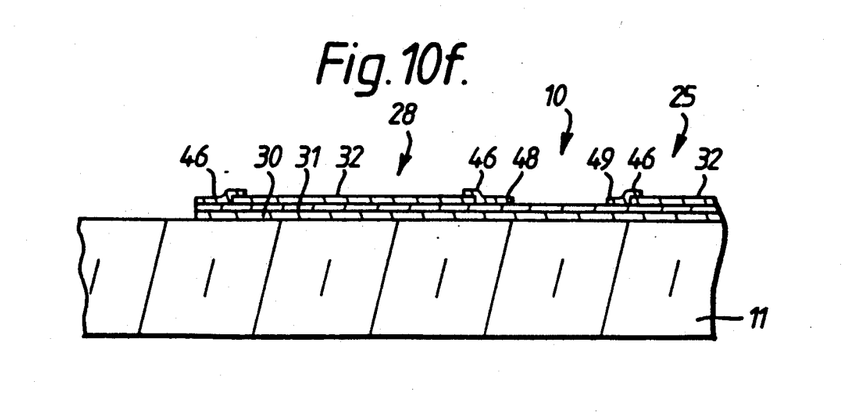

This structure is then subjected to a further, selective, etching process which acts on the aluminium material of the remaining parts of the layers 41 and 45. With the removal of the aluminium, those overlyaing regions of the chromium layer 46 are also removed, producing the end structure as shown in FIG. 10(f). As can be seen, the regions of the chromium layer 46 still remaining comprise strips, corresponding to the strips 40 of FIG. 9, bordering the edges of the remaining regions of ITO, i.e. the edges of the row conductors 28 and pad electrodes 25. Thus the row conductors and pad electrodes produced by this method are comprised of a combination of ITO material, as in the previous embodiment, together with the more highly conductive peripheral strips of chromium.

The MIM type devices 10 produced at the bridging portions 34 are basically identical to those of the previous embodiment except that their two terminals now principally comprise respective parts of the chromium strips of the address conductor and pad electrode immediately adjacent the ends of the bridging portion, 48 and 49 in FIG. 10(f).

Figure 8:
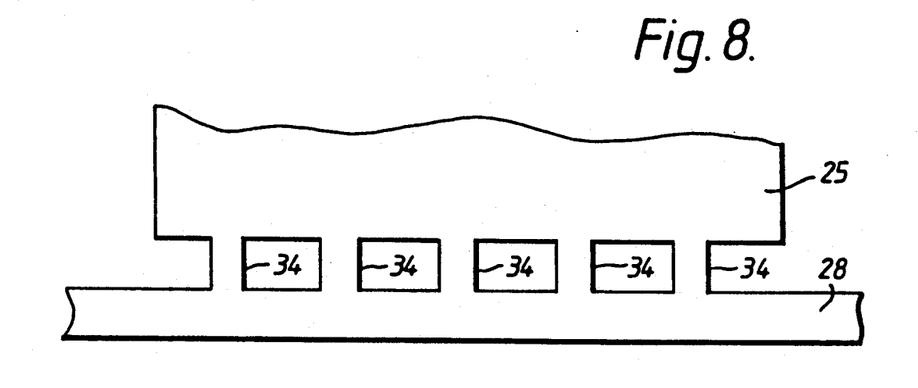
FIG. 8 is a schematic plan view of part of an alternative form of the display device.

Again, other materials may be employed for the layers 30, 31 and 32, as described with regard to the previous embodiment. Moreover, a metal other than chromium could be used for the layer 46. Also, a plurality of bridging portions producing a corresponding number of MIM type devices 10, can be formed between each pad electrodes 25 and the address conductor 28, as illustrated in FIG. 8. Materials other than aluminium could be used for the temporary layers 41 and 45, as will be apparent to persons skilled in the art.

Although more process steps are required in this method than the previous embodiment, it will be appreciated that, as with the previous embodiment, it uses only a single mask, and a single exposure, in the definition and fabrication of the components on the substrate and hence is a substantial improvement on known methods.

It will be appreciated that in the foregoing description references to row and column address conductors can be interchanged. Moreover, although the particular display device described is a liquid crystal display device, the invention is applicable also to other display devices using passive electro-optical display material, for example electrophorectic suspensions and electrochromic materials.

From reading the present disclosure, other modifications will be apparent to persons skilled in the art. Such modifications may involve other features which are already known in the fields of MIM devices and active matrix display devices and which may be used instead of or in addition to features already described herein.

We claim:

1. A method of fabricating an array of MIM type devices together with a set of address conductors and a plurality of pad electrodes on a common substrate, each pad electrode being connected with an associated address conductor via at least one MIM type device, comprising the steps of providing over the substrate surface superposed thin film layers forming a multilayer structure comprising in order from the substrate surface an insulating layer and a conductive layer, and thereafter patterning the multilayer structure by removing selected portions of the multilayer structure with the aid comprising the pad electrodes, the address conductors and at least one comparatively narrow portion bridging each pad electrode and its associated address conductor, and to remove a part of the conductive layer at each bridging portion to form a discontinuity in the conductive layer between the address conductor and the pad electrode, whereby a MIM type device is formed at each bridging portion.

2. A method according to claim 1, wherein the multilayer structure further includes a resistive layer over which the insulating and conductive layers are disposed.

3. A method according to claim 1, wherein the patterning of the multilayer structure comprises forming a resist pattern over the multilayer structure, anisotropically etching the exposed areas of the multilayer structure determined by the resist pattern until the exposed areas are completely removed and isotopically etching the multilayer structure under the resist pattern until parts of the conducive layer at the bridging portions are etched away.

4. A method according to claim 3, wherein the etching operation comprises a first stage in which said areas of the multilayer structure are removed by anisoptropic etching and a second stage in which the conductive layer parts at the bridging portions are removed by selective isotropic etching.

5. A method according to claim 1, wherein the conductive layer comprises transparent conductive material.

6. A method according to claim 2, wherein a border of metal is formed around the edges of the portions of the multilayer structure comprising the address conductors.

7. A method according to claim 6, wherein a border of metal is formed also around the edges of the portions of the multilayer structure comprising the pad electrodes.

8. A method according to claim 7, wherein after said etching operation a layer of metal is deposited over the substrate and thereafter predetermined areas of the metal layer are removed to leave said borders.

9. A method according to claim 8, wherein predetermined areas of the metal layer are removed by a lift-off process.

10. A method according to claim 9, wherein, prior to the patterning process, a first temporary layer is deposited over the conductive layer to form part of the multilayer structure, performing said etching operation whereby selected areas of the multilayer structure are completely removed and whereby said parts of the conductive layer at the bridging portions are removed together with overlying parts of the first temporary layer and the resist pattern, depositing completely over the substrate a second temporary layer, removing the remainder of the resist pattern together with overlying parts of the second temporary layer, depositing metal completely over the substrate, and thereafter removing the remaining portions of the first and second temporary layers together with the regions of the deposited metal overlying those portions.

11. A method according to claim 10, wherein the first and second temporary layers are of the same material.

12. A method according to claim 2, wherein the resistive layer comprises a substantially transparent wide band gap material.

13. A method according to claim 12, wherein the resistive layer comprises amorphous silicon material.

14. A method according to claim 12, wherein the resistive material comprises polycrystalline silicon material.

15. An active matrix addressed display device having a matrix of picture elements each comprising a first, pad, electrode and a second opposing electrode carried on facing surfaces of two spaced substrates with electro-optic material therebetween and with the pad electrode of each picture element being connected to an associated one of a set of address conductors on one substrate via at least one MIM type device, wherein the MIM type devices, the set of address conductors and the pad electrodes on the one substrate are fabricated by the method according to claim 1.

16. An active matrix addressed display device according to claim 15, wherein the electro-optic material comprises liquid crystal material.

17. A method according to claim 1, wherein the patterning of the multilayer structure comprises forming a resist pattern over the multilayer structure, anisotropically etching the exposed areas of the multilayer structure determined by the resist pattern until the exposed areas are completely removed and isotopically etching the multilayer structure under the resist pattern until parts of the conducive layer at the bridging portions are etched away.

18. A method according to claim 2, wherein the conductive layer comprises transparent conductive material.

19. A method according to claim 3, wherein the conductive layer comprises transparent conductive material.

20. A method according to claim 4, wherein the conductive layer comprises transparent conductive material.

21. A method according to claim 3, wherein a border of metal is formed around the edges of the portions of the multilayer structure comprising the address conductors.

22. A method according to claim 4, a border of metal is formed around the edges of the portions of the multilayer structure comprising the address conductors.

23. A method according to claim 5, wherein a border of metal is formed around the edges of the portions of the multilayer structure comprising the address conductors.

* * * * *